United States Patent
Min et al.

(10) Patent No.: US 9,490,214 B2
(45) Date of Patent: Nov. 8, 2016

(54) SEMICONDUCTOR DEVICE AND METHOD OF FABRICATING THE SAME

(71) Applicant: ELECTRONICS AND TELECOMMUNICATIONS RESEARCH INSTITUTE, Daejeon (KR)

(72) Inventors: Byoung-Gue Min, Daejeon (KR); Sang Choon Ko, Daejeon (KR); Jong-Won Lim, Daejeon (KR); Hokyun Ahn, Daejeon (KR); Hyung Sup Yoon, Daejeon (KR); Jae Kyoung Mun, Daejeon (KR); Eun Soo Nam, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/845,435

(22) Filed: Sep. 4, 2015

(65) Prior Publication Data

US 2015/0380354 A1 Dec. 31, 2015

Related U.S. Application Data

(62) Division of application No. 14/021,269, filed on Sep. 9, 2013, now Pat. No. 9,159,612.

(30) Foreign Application Priority Data

Oct. 15, 2012 (KR) .......................... 10-2012-0114266
Mar. 20, 2013 (KR) .......................... 10-2013-0029769

(51) Int. Cl.
*H01L 23/535* (2006.01)
*H01L 21/768* (2006.01)
(Continued)

(52) U.S. Cl.
CPC ....... *H01L 23/535* (2013.01); *H01L 21/02365* (2013.01); *H01L 21/28* (2013.01);
(Continued)

(58) Field of Classification Search
CPC .................. H01L 21/76877; H01L 21/02365; H01L 21/28; H01L 21/76898; H01L 23/481; H01L 2924/0002; H01L 2924/1305; H01L 2924/13091; H01L 2924/00; H01L 21/743
USPC ................ 257/194, 195, 701, 774, 750, 77, 257/E21.451, E23.169; 438/478, 571, 575, 438/576
See application file for complete search history.

(56) References Cited

U.S. PATENT DOCUMENTS

| 6,475,889 B1 * | 11/2002 | Ring .................. H01L 21/0445 257/E21.054 |
| 7,232,770 B2 | 6/2007 | Moore et al. |
| 2002/0055265 A1 | 5/2002 | Ring |

FOREIGN PATENT DOCUMENTS

| JP | 2004-056031 A | 2/2004 |
| JP | 2008-072028 A | 3/2008 |

(Continued)

OTHER PUBLICATIONS

L. F. Voss, et al., "SiC via fabrication for wide-band-gap high electron mobility transistor/microwave monolithic integrated circuit devices", J. Vac. Sci. Technol. B 26(2), pp. 487-494, Mar. 2008.

*Primary Examiner* — Thinh T Nguyen
(74) *Attorney, Agent, or Firm* — Rabin & Berdo, P.C.

(57) ABSTRACT

A semiconductor device may include a substrate having a lower via-hole, an epitaxial layer having an opening exposing a top surface of the substrate, a semiconductor chip disposed on the top surface of the substrate and including first, second, and third electrodes, an upper metal layer connected to the first electrode, a supporting substrate disposed on the upper metal layer and having an upper via-hole, an upper pad disposed on the substrate and extending into the upper via-hole, a lower pad connected to the second electrode in the opening, and a lower metal layer covering a bottom surface of the substrate and connected to the lower pad through the lower via-hole.

11 Claims, 7 Drawing Sheets

(51) Int. Cl.
*H01L 21/02* (2006.01)
*H01L 23/48* (2006.01)
*H01L 21/28* (2006.01)

(52) U.S. Cl.
CPC ... *H01L21/76877* (2013.01); *H01L 21/76898* (2013.01); *H01L 23/481* (2013.01); *H01L 2924/0002* (2013.01); *H01L 2924/1305* (2013.01); *H01L 2924/13091* (2013.01)

(56) References Cited

FOREIGN PATENT DOCUMENTS

| | | |
|---|---|---|
| KR | 10-0308041 B1 | 8/2001 |
| KR | 10-0797130 B1 | 1/2008 |
| KR | 2013-0013820 A | 2/2013 |

* cited by examiner

SEMICONDUCTOR DEVICE AND METHOD OF FABRICATING THE SAME

CROSS-REFERENCE TO RELATED APPLICATIONS

This is a Divisional of U.S. application Ser. No. 14/021,269, filed on Sep. 9, 2013, and allowed on Jun. 3, 2015. This U.S. non-provisional patent application claims priority under 35 U.S.C. §119 to Korean Patent Application Nos. 10-2012-0114266, filed on Oct. 15, 2012 and 10-2013-0029769, filed on Mar. 20, 2013, the entireties of which are incorporated by reference herein.

BACKGROUND

The inventive concept relates to a semiconductor device and a method of fabricating the same, more particularly, to a semiconductor device including a via-hole formed in a substrate and a method of fabricating the same.

Semiconductor devices have been more highly integrated with the miniaturization of electronic devices. A semiconductor chip may be electrically connected to an external circuit through bonding wires. A resistance and an inductance of the bonding wire may function as undesired factors in a circuit operation. Additionally, an area of the semiconductor device may be increased by pads surrounding the semiconductor chip.

The semiconductor device should exhaust heat generated from the semiconductor chip in order to prevent damage of the semiconductor device. The heat generated from the semiconductor chip may be generally exhausted through a substrate. However, the heat exhaust may not be sufficient enough, if a heat resistance of the substrate is great. Thus, a temperature of the semiconductor chip may increase, such that the semiconductor device may be unstably operated.

SUMMARY

Embodiments of the inventive concept may provide a semiconductor device with improved reliability and a method of fabricating the same.

Embodiments of the inventive concept may also provide a highly integrated semiconductor device and a method of fabricating the same.

In one aspect, a method of fabricating a semiconductor device may include: providing a substrate having a top surface and a bottom surface opposite to each other; forming an epitaxial layer on the top surface of the substrate; forming a lower pad contacting the top surface of the substrate; forming a semiconductor chip on the epitaxial layer, the semiconductor chip including a first electrode, a second electrode, and a third electrode; forming a lower via-hole penetrating the substrate, the lower via-hole exposing the lower pad; and forming a lower metal layer covering the bottom surface of the substrate, the lower metal layer extending into the lower via-hole and contacting the lower metal layer. Forming the lower pad may include: removing a portion of the epitaxial layer to expose the top surface of the substrate; and forming the lower pad directly on the exposed top surface of the substrate.

In an embodiment, the method may further include: forming an insulating layer exposing the first electrode on the semiconductor chip; forming an upper metal layer contacting the first electrode on the insulating layer; forming a supporting substrate having an upper via-hole on the upper metal layer; and forming an upper pad extending into the upper via-hole on the supporting substrate. The upper pad may be electrically connected to the first electrode through the upper metal layer.

In an embodiment, forming the lower via-hole may include: polishing the bottom surface of the substrate; and selectively etching the polished bottom surface of the substrate to form the lower via-hole exposing the lower pad.

In an embodiment, the lower pad may be disposed between the substrate and the second electrode; and the lower pad may vertically overlap with the second electrode.

In an embodiment, one of the first and second electrodes may be a source electrode; the other of the first and second electrodes may be a drain electrode; and the third electrode may be a gate electrode.

In an embodiment, one of the first and second electrodes may be an emitter electrode; the other of the first and second electrodes may be a collector electrode; and the third electrode may be a base electrode.

In another aspect, a semiconductor device may include: a substrate having a top surface and a bottom surface opposite to each other, the substrate having a lower via-hole, and the lower via-hole penetrating the substrate; an epitaxial layer disposed on the top surface of the substrate, the epitaxial layer having an opening; a lower pad disposed in the opening; a semiconductor chip disposed on the epitaxial layer, the semiconductor chip including a first electrode, a second electrode, and a third electrode; and a lower metal layer covering the top surface of the substrate, the lower metal layer connected to the lower pad through the lower via-hole. The opening may expose the top surface of the substrate.

In an embodiment, the lower pad may include: a first surface connected to the second electrode; a second surface opposite to the first surface; and a sidewall linking the first surface and the second surface. The sidewall of the lower pad may be in contact with the epitaxial layer.

In an embodiment, the semiconductor device may further include: an insulating layer disposed on the semiconductor chip and exposing the first electrode; an upper metal layer covering the insulating layer and connected to the first electrode; a supporting substrate disposed on the upper metal layer and having an upper via-hole; and an upper pad disposed on the supporting substrate and extending into the upper via-hole. The upper via-hole may expose the upper metal layer.

In an embodiment, the first electrode may be a drain electrode; the second electrode may be a source electrode; and the third electrode may be a gate electrode.

In still another aspect, a semiconductor device may include: a substrate having a top surface and a bottom surface opposite to each other; a semiconductor chip disposed on the top surface of the substrate, the semiconductor chip including a first electrode, a second electrode, and a third electrode; an upper metal layer disposed on the semiconductor chip, the upper metal layer electrically connected to the first electrode; a supporting substrate disposed on the upper metal layer; an upper pad disposed on the supporting substrate, the upper pad electrically connected to the upper metal layer; a lower pad disposed between the substrate and the second electrode; and a lower metal layer covering the bottom surface of the substrate. The substrate may have a lower via-hole exposing the lower pad; and the lower metal layer may extend into the lower via-hole to be in contact with the lower pad.

In an embodiment, the semiconductor device may further include: a buffer layer and a channel layer sequentially stacked on the top surface of the substrate.

In an embodiment, the lower pad may include: a first surface contacting the second electrode; a second surface spaced apart from the first surface and contacting the top surface of the substrate; and a sidewall linking the first and second surfaces. The sidewall of the lower pad may be in contact with the buffer layer and the channel layer.

In an embodiment, the upper metal layer may include a first upper metal layer contacting the first electrode and a second upper metal layer contacting the second electrode; and the first upper metal layer may be spaced apart from the second upper metal layer.

In an embodiment, the upper pad may be vertically spaced apart from the first electrode.

In an embodiment, one of the first and second electrodes may be a source electrode; the other of the first and second electrodes may be a drain electrode; and the third electrode may be a gate electrode.

In an embodiment, the substrate may have a thickness of about 10 μm to about 100 μm.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
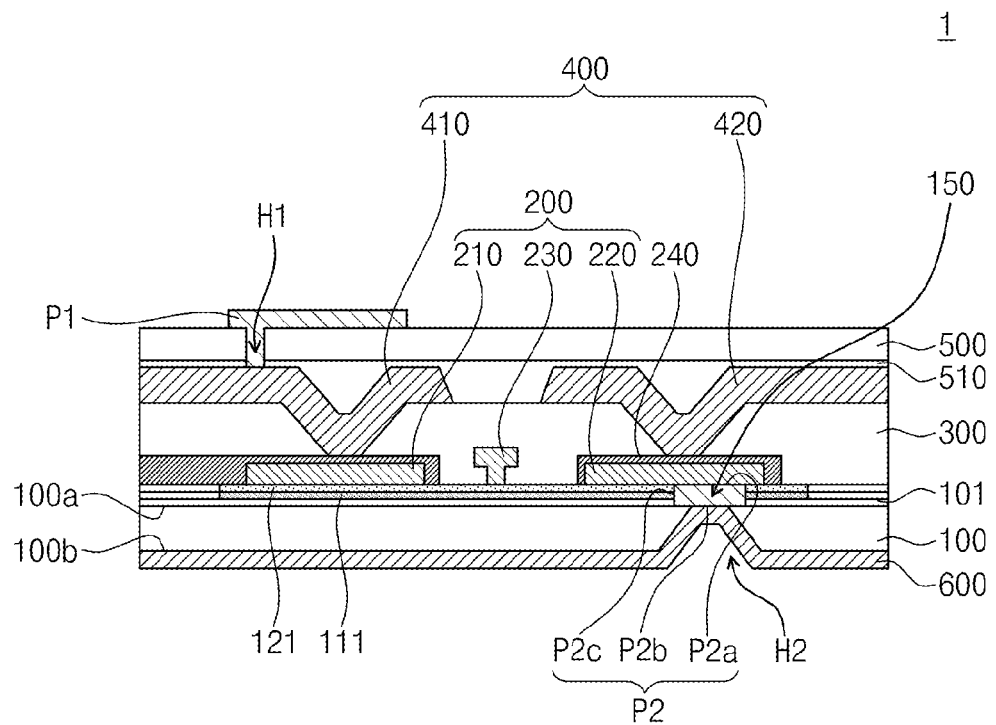
FIG. 1 is a cross-sectional view illustrating a semiconductor device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, semiconductor devices according to the inventive concept will be described with reference to the drawings.

FIG. 1 is a cross-sectional view illustrating a semiconductor device according to some embodiments of the inventive concept.

Referring to FIG. 1, a semiconductor device 1 may include a substrate 100, a semiconductor chip 200, an insulating layer 300, an upper metal layer 400, an upper pad P1, a lower pad P2, a supporting substrate 500, and a lower metal layer 600. The semiconductor chip 200 may include a first electrode 210, a second electrode 220, and a third electrode 230.

The substrate 100 may have a top surface 100a and a bottom surface 100b opposite to each other. The substrate 100 may have a lower via-hole H2 exposing the lower pad P2. The lower via-hole H2 may penetrate the substrate 100 from the bottom surface 100b to the top surface 100a. The substrate 100 may have a thickness of about 10 μm to about 100 μm. The substrate 100 may have the thickness of about 100 μm or less, such that heat generated from the semiconductor chip 200 may be easily exhausted through the substrate 100 outside the semiconductor device 1. In an embodiment, the substrate 100 may include a semiconductor material (e.g., silicon (Si), silicon carbide (SiC), gallium arsenide (GaAs), indium phosphide (InP), or gallium nitride (GaN)). In another embodiment, the substrate 100 may be a sapphire substrate including aluminum oxide ($Al_2O_3$).

The substrate 100 may include a buffer layer 111 and a channel layer 121 that are sequentially stacked on the top surface 100a. The buffer layer 111 and the channel layer 121 may be epitaxial layers. The buffer layer 111 may include a nitride such as gallium nitride (GaN). The channel layer 121 may include a nitride such as aluminum-gallium nitride (AlGaN). A transition layer 101 may be disposed between the substrate 100 and the channel layer 121. The transition layer 101 may include a nitride such as aluminum nitride (AlN) or indium-aluminum nitride (InAlN). The transition layer 101, the buffer layer 111, and the channel layer 121 may have an opening 150 exposing the top surface 100a of the substrate 100.

The lower pad P2 may be disposed between the substrate 100 and the second electrode 220. The lower pad P2 may have a first surface P2a, a second surface P2b, and a sidewall P2c. The first surface P2a of the lower pad P2 may be in contact with the second electrode 220. The second surface P2b of the lower pad P2 may be opposite to the first surface P2a and may be in contact with the substrate 100. The sidewall P2c of the lower pad P2 may link the first and second surfaces P2a and P2b. The first surface P2a of the lower pad P2 may be substantially parallel to the top surface 100a of the substrate 100. The sidewall P2c of the lower pad P2 may be in contact with the buffer layer 111 and the channel layer 121. The lower pad P2 may include a material having an etch selectivity with respect to the substrate 100. Additionally, the lower pad P2 may include a conductive material. For example, the lower pad P2 may include a metal (e.g., titanium (Ti), gold (Au), or nickel (Ni)) or a transparent conductive oxide (e.g., indium-tin oxide (ITO)).

The semiconductor chip 200 may be disposed on the substrate 100. A portion of the semiconductor chip 200 may be disposed on the lower pad P2, so as to be electrically connected to the lower pad P2. The semiconductor chip 200 may be a high electron mobility transistor (HEMT) device.

The first electrode 210 and the second electrode 220 of the semiconductor chip 200 may be laterally spaced apart from each other on the top surface 100a of the substrate 100. The second electrode 220 may be disposed on the top surface of the lower pad P2. As described above, the second electrode 220 may be in contact with the lower pad P2. According to embodiments of the inventive concept, the second electrode 220 may vertically overlap with the lower pad P2 to reduce a planar area of the semiconductor device 1. If a lower pad and a second electrode are laterally spaced apart from each other, a planar area of a semiconductor chip may increase. However, the second electrode 220 according to the inventive concept is vertically stacked on the lower pad P2, such that the planar area of the semiconductor chip 1 may be reduced or minimized. One of the first and second electrodes 210 and 22 may be a source electrode, and the other of the first and second electrodes 210 and 220 may be a drain electrode. The first and second electrodes 210 and 220 may include a conductive material, for example, a metal such as titanium (Ti), aluminum (Al), nickel (Ni), or gold (Au).

The third electrode 230 of the semiconductor chip 200 may be disposed on the top surface 100a of the substrate 100. The third electrode 230 may be disposed between the first electrode 210 and the second electrode 220. The third electrode 230 may have a T-shape. The third electrode 230 may be a gate electrode. The third electrode 230 may include a conductive material.

Conductive lines 240 may be provided on the top surface 100a of the substrate 100. The conductive lines 240 may be electrically connected to the first electrode 210, the second electrode 220, and the third electrode 230, respectively. The conductive lines 240 may be in contact with the first electrode 210, the second electrode 220, and the third electrode 230, respectively. The conductive lines 240 may include a conductive material.

The insulating layer 300 may be disposed on the first electrode 210, the second electrode 220, and/or the third electrode 230. The insulating layer 300 may have a pattern. The insulating layer 300 may expose the first electrode 210, the second electrode 220, and the third electrode 230. In an embodiment, the insulating layer 300 may include an oxide (e.g., silicon oxide or aluminum oxide) or a nitride (e.g., silicon nitride). In another embodiment, the insulating layer 300 may include a polymer (e.g., benzocyclobutene (BCB)).

The upper metal layer 400 may be disposed on the insulating layer 300. The upper metal layer 400 may include a first upper metal layer 410 and a second upper metal layer 420 that are connected to the first electrode 210 and the second electrode 220, respectively. The first upper metal layer 410 is spaced apart from the second upper metal layer 410, such that the first electrode 210 is electrically insulated from the second electrode 220. The upper metal layer 400 may function as a thermal shunt of the first, second, and/or third electrodes 210, 220, and 230.

The supporting substrate 500 may be disposed on the upper metal layer 400. The supporting substrate 500 may be a silicon substrate. An upper via-hole H1 may penetrate the supporting substrate 500. An adhesive layer 510 may be disposed between the upper metal layer 400 and the supporting substrate 500. The adhesive layer 510 may include a polymer, for example, benzocyclobutene (BCB). The supporting substrate 500 may physically support the semiconductor device 1. Thus, even through the substrate 100 has the thickness of about 10 μm to about 100 μm, the semiconductor chip 1 may not be damaged.

The upper pad P1 may be disposed on the supporting substrate 500. The upper pad P1 may extend into the upper via-hole H1, so as to be connected to the upper metal layer 400. The upper pad P1 may be disposed at a position corresponding to the first electrode 210. For example, the upper pad P1 may be vertically spaced apart from the first electrode 210. In other words, the upper pad P1 may vertically overlap with the first electrode 210. The upper pad P1 may include a conductive material. Since the upper pad P1 vertically overlaps with the first electrode 210, the planar area of the semiconductor device 1 may be more reduced as compared with that of a semiconductor device that includes an upper pad and a first electrode laterally spaced apart from each other.

The lower metal layer 600 may cover the bottom surface 100b of the substrate 100. The lower metal layer 600 may extend into the lower via-hole H2, so as to be connected to the lower pad P2. The lower metal layer 600 may have a thickness of about 5 μm to about 10 μm. If the first electrode 210 is the drain electrode, the upper pad P1 may have a pattern. If the second electrode 220 is the drain electrode, the lower pad P2 may have a pattern.

Figure 2:
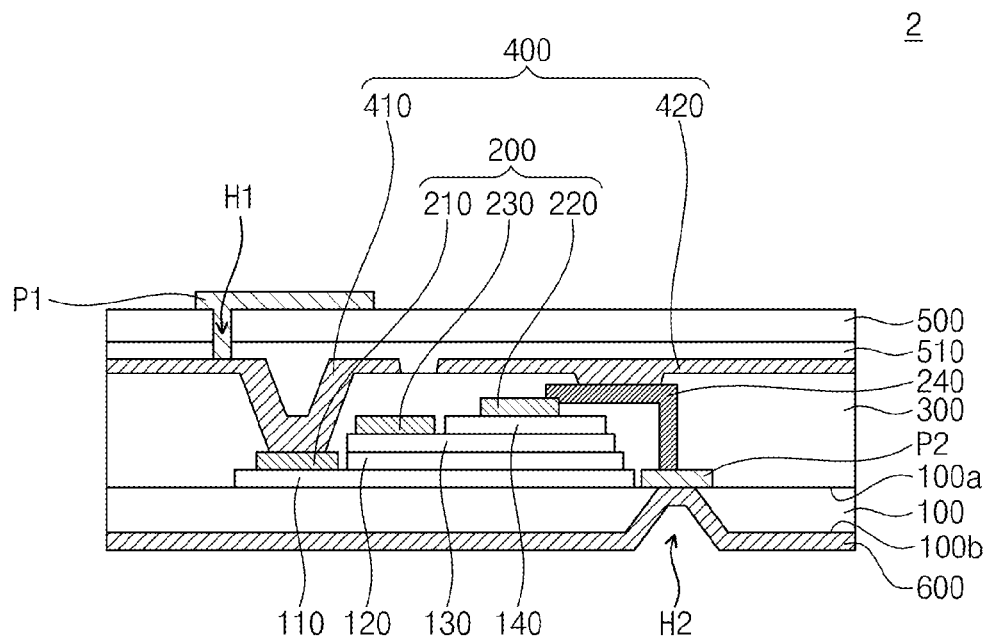
FIG. 2 is a cross-sectional view illustrating a semiconductor device according to other embodiments of the inventive concept.

FIG. 2 is a cross-sectional view illustrating a semiconductor device according to other embodiments of the inventive concept. The descriptions to the same elements as described in the aforementioned embodiment will be omitted or mentioned briefly for the purpose of ease and convenience in explanation.

Referring to FIG. 2, a semiconductor device 2 may include a substrate 100, a semiconductor chip 200, an insulating layer 300, an upper metal layer 400, an upper pad P1, a lower pad P2, a supporting substrate 500, and a lower metal layer 600.

The substrate 100 may have a lower via-hole H2 exposing the lower pad P2. The lower pad P2 may be in contact with the top surface 100a of the substrate 100. The lower pad P2 may include a conductive material. A first epitaxial layer 110, a second epitaxial layer 120, a third epitaxial layer 130, and a fourth epitaxial layer 140 may be sequentially stacked on the top surface 100a of the substrate 100.

The semiconductor chip 200 may be formed on the first epitaxial layer 110. The semiconductor chip 200 may be a heterojunction bipolar transistor (HBT) device. The semiconductor chip 200 may include a first electrode 210, a second electrode 220, and a third electrode 230. The first electrode 210 may be a collector electrode, the second electrode 220 may be an emitter electrode, and the third electrode 230 may be a base electrode. The first epitaxial layer 110 may function as a sub-collector layer, and the second epitaxial layer 120 may function as a collector layer. The third epitaxial layer 130 may function as a base layer, and the fourth epitaxial layer 140 may function as an emitter layer. The first, second, and third electrodes 210, 220, and 230 may include a conductive material such as a metal. A conductive line 240 may electrically connect the second electrode 220 to the lower pad P2.

The insulating layer 300 may be provided on the semiconductor chip 200. The insulating layer 300 may have a pattern, so as to expose the first electrode 210, the third electrode 230, and/or the conductive line 240. The insulating layer 300 may include the same material as or a similar material to the insulating layer 300 of FIG. 1.

The upper metal layer 400 may be disposed on the insulating layer 300. The upper metal layer 400 may include a first upper metal layer 410 and a second upper metal layer 420. The first upper metal layer 410 may electrically connect the first electrode 210 to the upper pad P1. The second upper metal layer 420 may be connected to the conductive line 240. Thus, the second upper metal layer 420 may function as a thermal shunt of the second electrode 220.

The supporting substrate 500, an adhesive layer 510, and the upper pad P1 may be disposed on the upper metal layer 400. The supporting substrate 500 may have an upper via-hole H1 exposing the first upper metal layer 410. The upper pad P1 may extend into the upper via-hole H1 and may be connected to the upper metal layer 400 (i.e., the first upper metal layer 410). The upper pad P1 may be vertically spaced apart from the first electrode 210. In other words, the upper pad P1 may be disposed over the first electrode 210. The lower metal layer 600 may cover the bottom surface 100b of the substrate 100. The lower metal layer 600 may extend into the lower via-hole H2 and may be connected to the lower pad P2.

Next, methods of fabricating a semiconductor device according to the inventive concept will be described with reference to the drawings.

FIGS. 3 to 10 are cross-sectional views illustrating a method of fabricating a semiconductor device according to some embodiments of the inventive concept. The descriptions to the same elements as described in the embodiments described above will be omitted or mentioned briefly for the purpose of ease and convenience in explanation.

Figure 3:
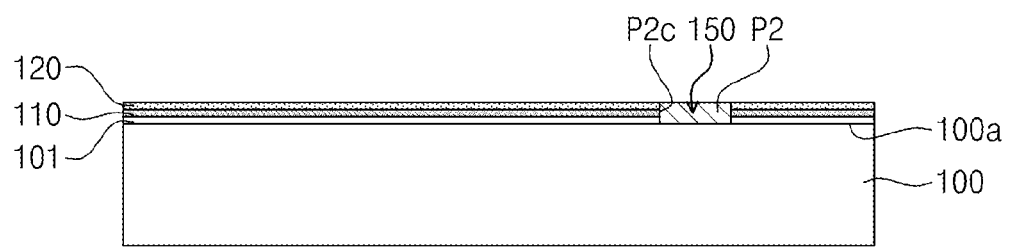
FIGS. 3 to 10 are cross-sectional views illustrating a method of fabricating a semiconductor device according to some embodiments of the inventive concept.

Referring to FIG. 3, a substrate 100 may be prepared to include a transition layer 101, a first epitaxial layer 110, a second epitaxial layer 120, and a lower pad P2. Materials included in the substrate 100, the transition layer 101, the first epitaxial layer 110, the second epitaxial layer 120, and the lower pad P2 may be the same as or similar to those described with reference to FIG. 1. If the substrate 100 includes silicon carbide (SiC), the first epitaxial layer 110 may be difficult to be formed on the substrate 100 by a difference between lattice constants of the substrate 100 and the first epitaxial layer 110. However, the transition layer 101 may be formed on the substrate 100, such that the first epitaxial layer 110 may be easily formed on the transition layer 101. The second epitaxial layer 120, the first epitaxial layer 110, and the transition layer 101 may be patterned to form an opening 150. The patterning process may be performed by a photolithography process and a dry etching process. The lower pad P2 may be formed in the opening 150. The lower pad P2 may be in contact with the top surface 100a of the substrate 100. The lower pad P2 may be formed by depositing the conductive material described with reference to FIG. 1 in the opening 150. The sidewall P2c of the second pad P2 may be in contact with the first epitaxial layer 110 and/or the second epitaxial layer 120.

Figure 4:
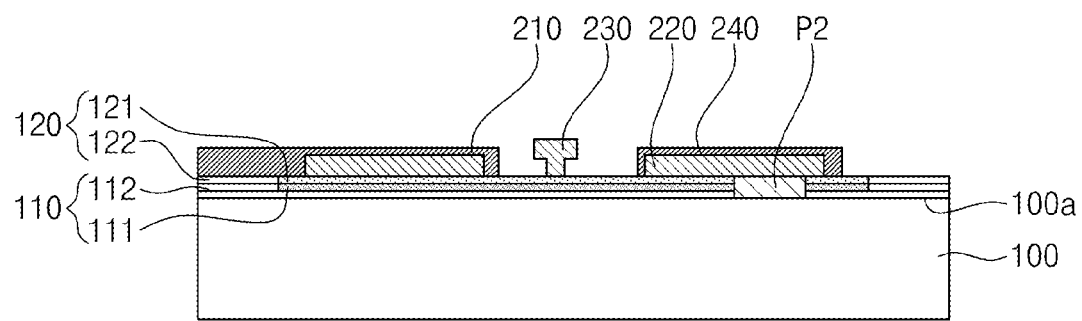

Referring to FIG. 4, a first electrode 210 and a second electrode 220 may be formed on the top surface 100a of the substrate 100. The first and second electrodes 210 and 220 may be laterally spaced apart from each other on the top surface 100a of the substrate 100. The second electrode 220 may be formed on the lower pad P2. The second electrode 220 may be in contact with the lower pad P2. A conductive material may be deposited and then may be patterned to form the first and second electrodes 210 and 220. A device isolation region 112 and 122 may be defined in the first epitaxial layer 110 and/or the second epitaxial layer 120 to form a buffer layer 111 and/or a channel layer 121. An ion implantation process may be selectively performed on the first epitaxial layer 110 and/or the second epitaxial layer 120 to form the device isolation region 112 and 122. The device isolation region 112 and 122 has an electrical insulation property by the ion implantation process. In another embodiment, the first epitaxial layer 110 and/or the second epitaxial layer 120 may be selectively etched to define a device isolation region of a mesa structure. A third electrode 230 may be formed between the first electrode 210 and the second electrode 220. The third electrode 230 may be formed to have a T-shaped cross section. Conductive lines 240 may be formed on the substrate 100. The conductive lines 240 may be connected to the first electrode 210, the second electrode 220, and the third electrode 230, respectively. In an embodiment, a conductive material may be deposited and then be patterned to form the conductive lines 240. In another embodiment, the conductive lines 240 may be formed by a plating method.

Figure 5:
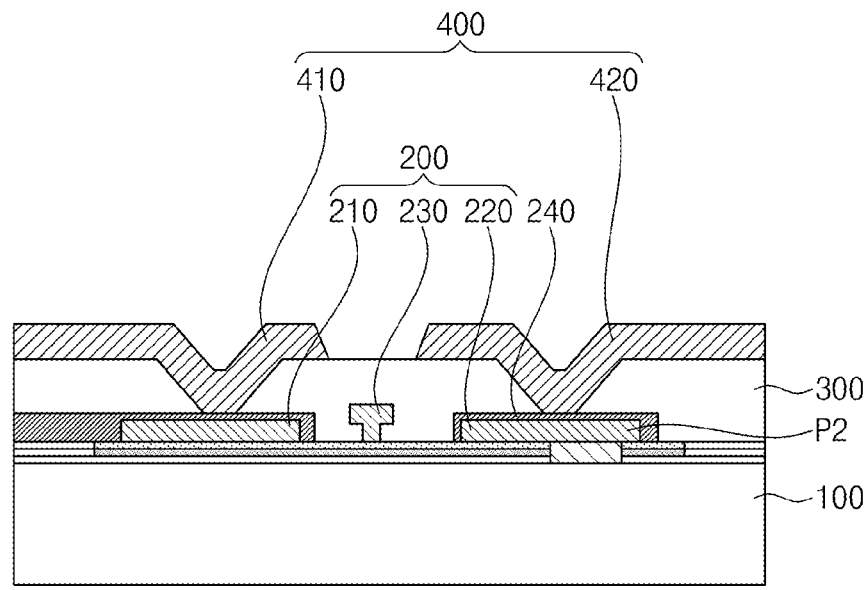

Referring to FIG. 5, an insulating layer 300 having a pattern may be formed on the semiconductor chip 200. In an embodiment, the insulating layer 300 may be formed to cover the semiconductor chip 200. The insulating layer 300 may be patterned to expose the first, electrode 210, the second electrode 220, and the third electrode 230. The patterning process of the insulating layer 300 may be performed by a lithography process and/or an etching process. An upper metal layer 400 having a pattern may be formed on the insulating layer 300. The upper metal layer 400 may include a first upper metal layer 410 connected to the first electrode 210 and a second upper metal layer 420 connected to the second electrode 220. The first upper metal layer 410 may be spaced apart from the second upper metal layer 420.

Figure 6:
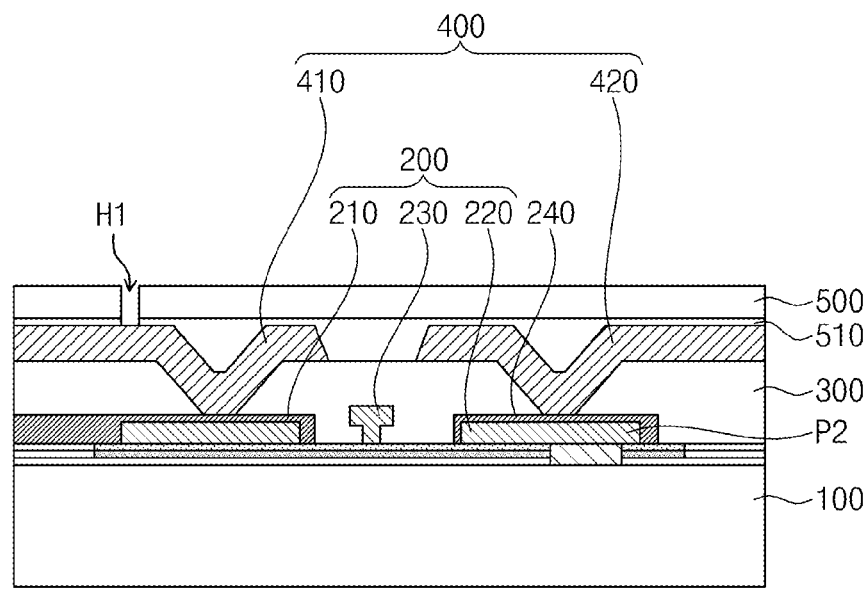

Referring to FIG. 6, a supporting substrate 500 having an upper via-hole H1 may be formed on the upper metal layer 400. In an embodiment, an adhesive layer 510 may be coated on the supporting substrate 500 and then the adhesive layer 510 of the supporting substrate 500 may become in contact with the insulating layer 300. Next, the adhesive layer 510 may be hardened to bond the supporting substrate 500 to the insulating layer 300. The supporting substrate 500 may be patterned to form the upper via-hole H1 penetrating the supporting substrate 500. In another embodiment, the upper via-hole H1 may be formed in the supporting substrate 500 and then the supporting substrate 500 having the upper via-hole H1 may be bonded to the insulating layer 300. The upper via-hole H1 may expose the first upper metal layer 410. The supporting substrate 500 may be polished to reduce a thickness of the supporting substrate 500.

Figure 7:
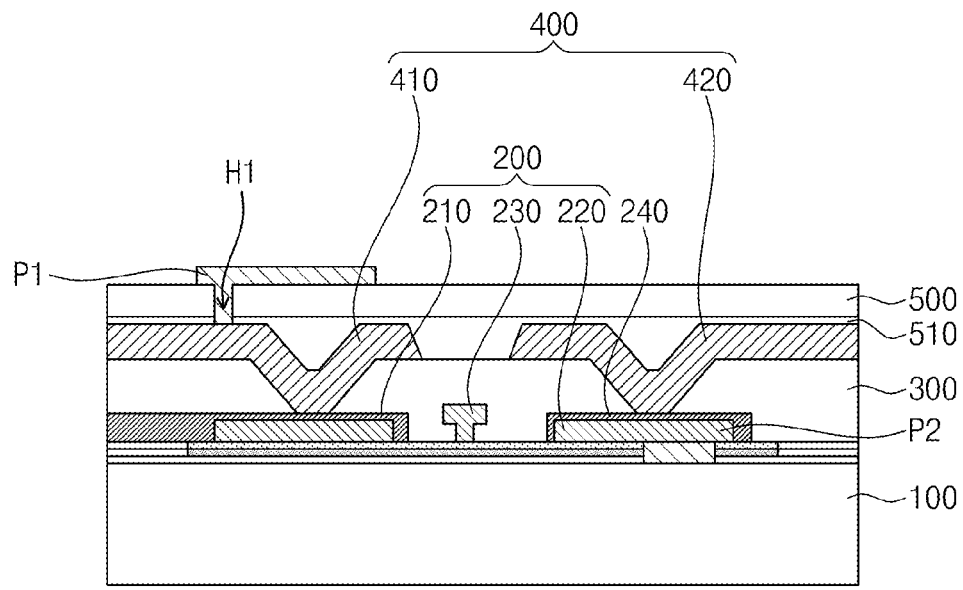

Referring to FIG. 7, an upper pad P1 may be formed on the supporting substrate 500. The upper pad P1 may extend into the upper via-hole H1, so as to be in contact with the upper metal layer 400. The upper pad P1 may be electrically connected to the first electrode 210. The upper pad P1 may be vertically spaced apart from the first electrode 210.

Figure 8:
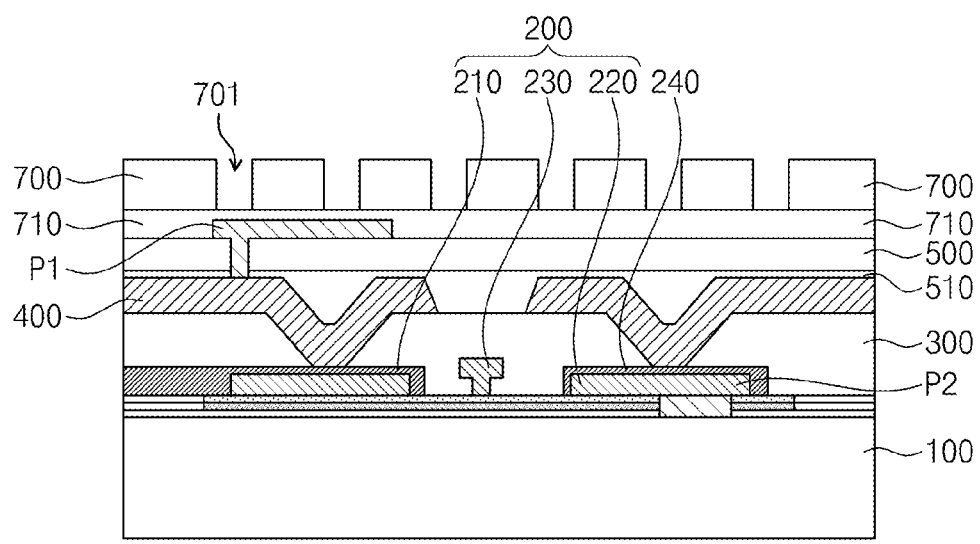

Referring to FIG. 8, a carrier adhesive layer 710 may be formed on the supporting substrate 500 to cover the upper pad P1. The carrier adhesive layer 710 may include a thermoplastic polymer or benzocyclobutene (BCB). A carrier substrate 700 may be formed on the supporting substrate 500. In an embodiment, the carrier substrate 700 may be a carrier wafer that has holes 701 formed by a laser process. The hole 701 may have a diameter of about 100 µm to about 1 mm. The carrier substrate 700 may be a sapphire substrate or a silicon carbide substrate.

Figure 9:
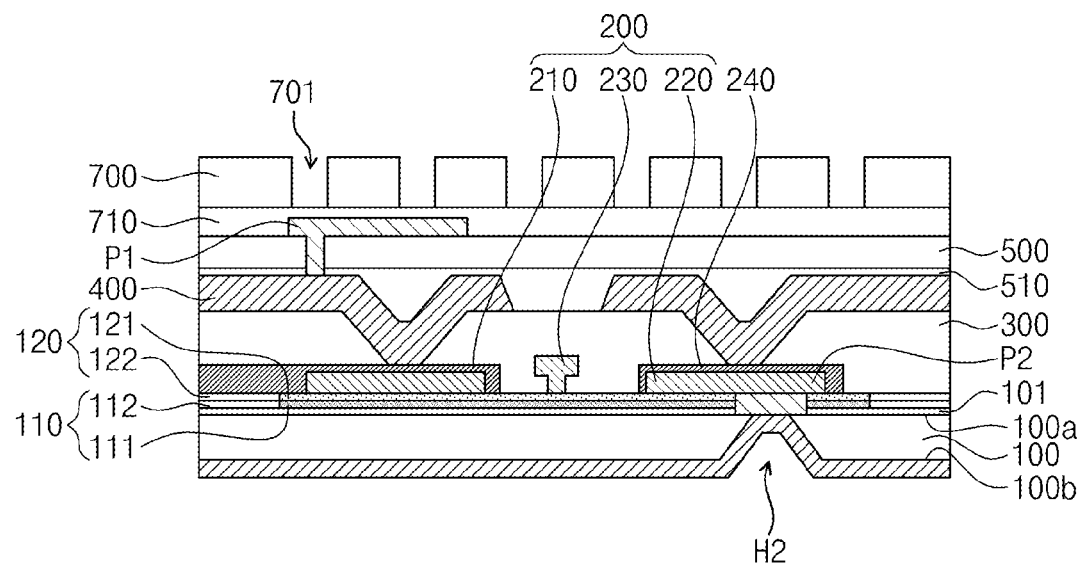

Referring to FIG. 9, a bottom surface 100b of the substrate 100 may be polished to reduce a thickness of the substrate 100. For example, the substrate 100 may be polished to have a thickness of about 10 µm to about 100 µm. If the thickness of the substrate 100 is greater than about 100 µm, heat generated from the semiconductor chip 200 may not be exhausted through the substrate 100. If the thickness of the substrate 100 is less than about 10 µm, handling of the substrate 100 may be difficult. Even though the substrate 100 has the reduced thickness of about 10 µm to about 100 µm, the supporting substrate 500 may support the semiconductor chip 200. The substrate 100 may be selectively etched to form a lower via-hole H2 penetrating the substrate 100. The lower via-hole H2 may expose the lower pad P2. The lower via-hole H2 may be formed using an ion milling process, a reactive ion etching (RIE) process, or an inductively coupled plasma (ICP) etching process. Since the thickness of the substrate 100 is reduced, the lower via-hole H2 may be easily formed. Since the lower pad P2 is in contact with the top surface 100a of the substrate 100, the transition layer 101, the first epitaxial layer 110, and the second epitaxial layer 120 are not etched during the etching process for the formation of the lower via-hole H2. If the lower pad P2 is formed on the second epitaxial layer 120, the substrate 100, the transition layer 101, and the first and second epitaxial layers 110 and 120 should be successively etched for the formation of the lower via-hole H2. However, according to the inventive concept, the lower pad P2 may be in contact with the substrate 100, such that it is possible to reduce an etched thickness of the etching process for the formation of the lower via-hole H2. Additionally, it is possible to prevent byproducts caused by etching of the epitaxial layers 110 and 120 and the transition layer 101. The lower pad P2 may function as an etch stop layer during the etching process. In the polishing process of the substrate 100, the carrier substrate 700 may prevent the semiconductor chip 200 from being damaged.

Figure 10:
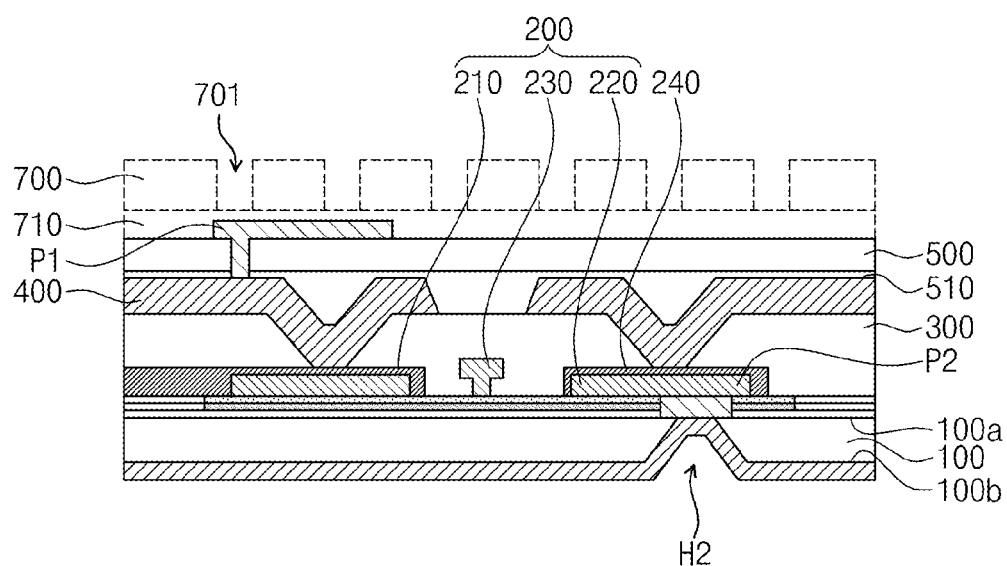

Referring to FIG. 10, a lower metal layer 600 may be formed to cover the bottom surface 100b of the substrate 100. The lower metal layer 600 may be connected to the lower pad P2. In an embodiment, a seed metal layer may be formed and then a metal material may be deposited to form the lower metal layer 600. The lower metal layer 600 may include a metal such as titanium (Ti) or gold (Au). The lower metal layer 600 may have a thickness of about 5 µm to about 10 µm. The carrier substrate 700 and the carrier adhesive layer 710 may be removed. For example, the carrier adhesive layer 710 may be easily removed by a stripper supplied through the hole 701 of the carrier substrate 700. The carrier substrate 700 may be separated along with the carrier adhesive layer 710. Since the carrier substrate 700 is easily removed due to the hole 701, the substrate 100 and the insulating layer 300 may not be damaged by the stripper. As a result, the semiconductor device 1 of FIG. 1 may be realized.

FIGS. 11 to 14 are cross-sectional views illustrating a method of fabricating a semiconductor device according to other embodiments of the inventive concept. The descriptions to the same elements as described in the embodiments described above will be omitted or mentioned briefly for the purpose of ease and convenience in explanation.

Figure 11:
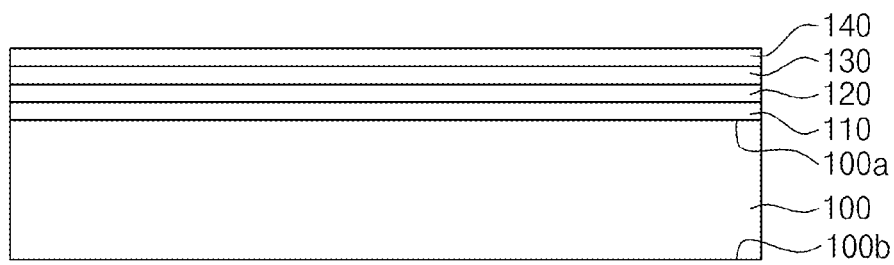
FIGS. 11 to 14 are cross-sectional views illustrating a method of fabricating a semiconductor device according to other embodiments of the inventive concept.

Referring to FIG. 11, a first epitaxial layer 110, a second epitaxial layer 120, a third epitaxial layer 130 and a fourth epitaxial layer 140 may be sequentially formed on a top surface 100a of the substrate 100.

Figure 12:
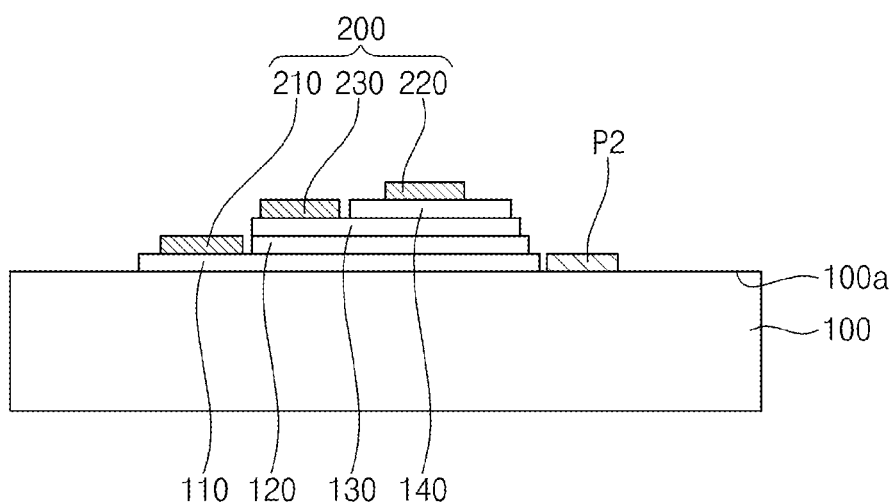

Referring to FIG. 12, a semiconductor chip 200 may be formed on the top surface 100a of the substrate 100. The semiconductor chip 200 may be the HBT device described with reference to FIG. 2. Forming the semiconductor chip 200 may include: forming a second electrode 220 on the fourth epitaxial layer 140; forming a third electrode 230 on the third epitaxial layer 130; and forming a first electrode 210 on the first epitaxial layer 110. At this time, the fourth epitaxial layer 140, the third epitaxial layer 130, the second epitaxial layer 120, and the first epitaxial layer 110 may be patterned in the order named. A portion of the top surface 100a of the substrate 100 may be exposed by patterning the first epitaxial layer 110. A lower pad P2 may be formed on the exposed top surface 100a of the substrate 100, so as to be in contact with the exposed top surface 100a of the substrate 100.

Figure 13:
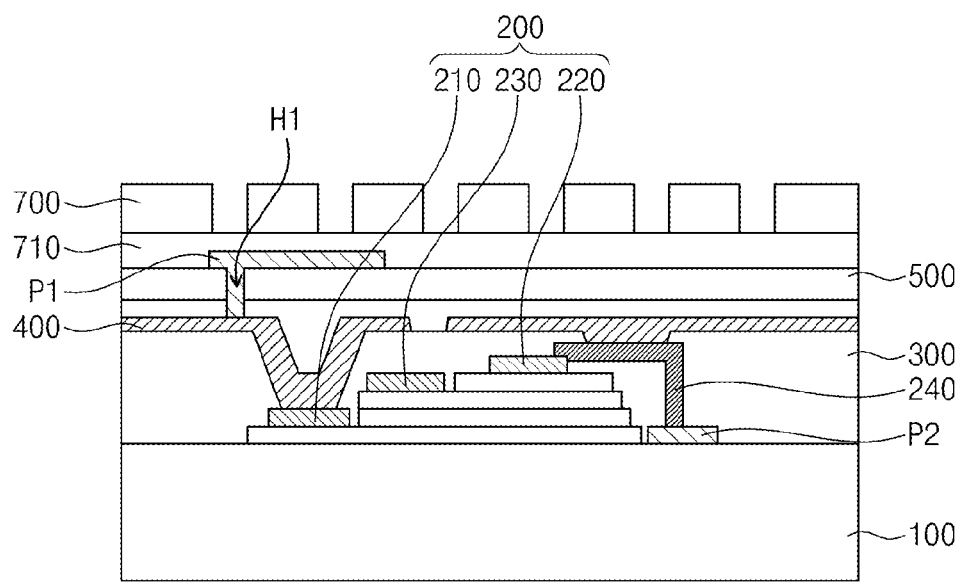

Referring to FIG. 13, a conductive line 240 may be formed on the top surface 100a of the substrate 100. The conductive line 240 may electrically connect the second electrode 220 to the lower pad P2. An insulating layer 130 may be formed on the semiconductor chip 200. The insulating layer 300 may be patterned to expose the first electrode 210, the third electrode 230, and/or the conductive line 240. An upper metal layer 400 having a pattern may be formed on the insulating layer 300. A supporting substrate 500 having an upper via-hole H1 may be formed on the upper metal layer 400. The supporting substrate 500 may be bonded to the upper metal layer 400 by an adhesive layer 510. The upper via-hole H1 may expose the second electrode 220 and/or the third electrode 230. The supporting substrate 500 may be polished to reduce a thickness of the supporting substrate 500. An upper pad P1 may be formed on the supporting substrate 500. The upper pad P1 may extend into the upper via-hole H1 to be in contact with the upper metal layer 400. A carrier adhesive layer 710 and a carrier substrate 700 may be formed on the supporting substrate 500.

Figure 14:
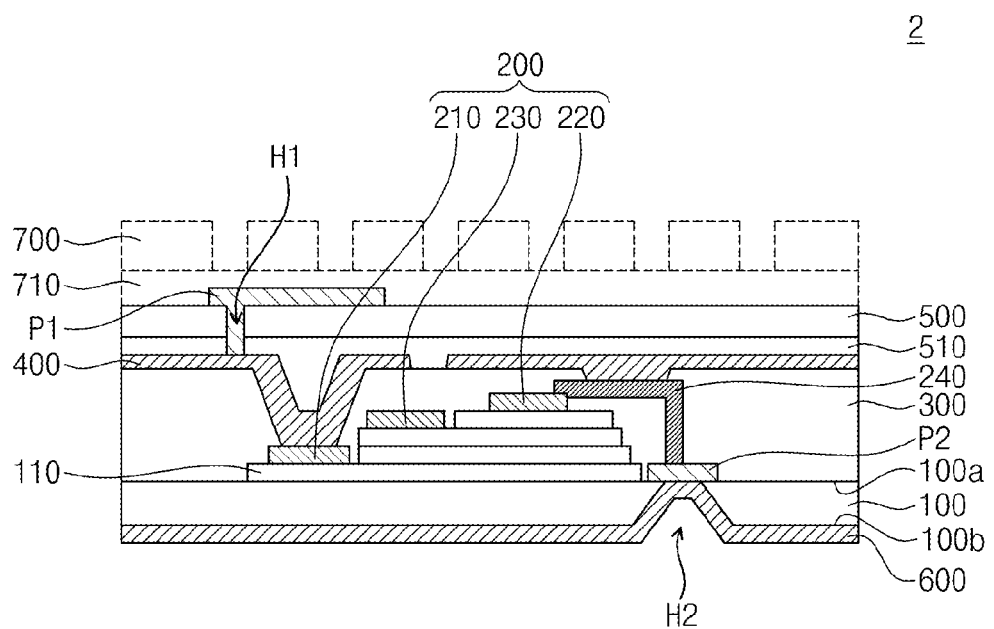

Referring to FIG. 14, a bottom surface 100b of the substrate 100 may be polished to reduce a thickness of the substrate 100. For example, the substrate 100 may be polished to have a thickness of about 10 µm to about 100 µm. The substrate 100 may be selectively etched to form a lower via-hole H2 penetrating the substrate 100. The lower via-hole H2 may expose the lower pad P2. Since the lower pad P2 is in contact with the top surface 100a of the substrate 100, the first epitaxial layer 100 is not etched during the etching process for the formation of the lower via-hole H2. Thus, the lower via-hole H2 may be easily formed. A lower metal layer 600 may be formed to cover the bottom surface 100b of the substrate 100. The carrier substrate 700 and the carrier adhesive layer 710 may be completely removed by a stripper. As a result, the semiconductor chip 2 illustrated in FIG. 2 may be realized.

According to embodiments of the inventive concept, the epitaxial layer may be patterned to expose the top surface of the substrate, and then the lower pad may be formed to be in contact with the exposed top surface of the substrate. Thus, the epitaxial layer may not be etched during the formation process of the lower via-hole. Additionally, the thickness of the substrate may be reduced, such that the lower via-hole may be easily formed. Moreover, the upper pad may be vertically spaced apart from the first electrode, and the lower pad may vertically overlap with the second electrode. Thus, a planar area that the electrodes and pads occupy may be reduced. As a result, highly integrated semiconductor devices may be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   a substrate having a top surface and a bottom surface opposite to each other, the substrate having a lower via-hole, and the lower via-hole penetrating the substrate;
   an epitaxial layer disposed on the top surface of the substrate, the epitaxial layer having an opening;
   a lower pad disposed in the opening;
   a semiconductor chip disposed on the epitaxial layer, the semiconductor chip including a first electrode, a second electrode, and a third electrode; and
   a lower metal layer covering the top surface of the substrate, the lower metal layer connected to the lower pad through the lower via-hole,
   wherein the opening exposes the top surface of the substrate.

2. The semiconductor device of claim 1, wherein the lower pad comprises:
   a first surface connected to the second electrode;
   a second surface opposite to the first surface; and
   a sidewall linking the first surface and the second surface,
   wherein the sidewall of the lower pad is in contact with the epitaxial layer.

3. The semiconductor device of claim 1, further comprising:
   an insulating layer disposed on the semiconductor chip and exposing the first electrode;
   an upper metal layer covering the insulating layer and connected to the first electrode;
   a supporting substrate disposed on the upper metal layer and having an upper via-hole; and
   an upper pad disposed on the supporting substrate and extending into the upper via-hole,
   wherein the upper via-hole exposes the upper metal layer.

4. The semiconductor device of claim 1, wherein the first electrode is a drain electrode;
   wherein the second electrode is a source electrode; and
   wherein the third electrode is a gate electrode.

5. A semiconductor device comprising:
   a substrate having a top surface and a bottom surface opposite to each other;
   a semiconductor chip disposed on the top surface of the substrate, the semiconductor chip including a first electrode, a second electrode, and a third electrode;
   an upper metal layer disposed on the semiconductor chip, the upper metal layer electrically connected to the first electrode;
   a supporting substrate disposed on the upper metal layer;
   an upper pad disposed on the supporting substrate, the upper pad electrically connected to the upper metal layer;
   a lower pad disposed between the substrate and the second electrode; and
   a lower metal layer covering the bottom surface of the substrate,
   wherein the substrate has a lower via-hole exposing the lower pad; and
   wherein the lower metal layer extends into the lower via-hole to be in contact with the lower pad.

6. The semiconductor device of claim 5, further comprising:
   a buffer layer and a channel layer sequentially stacked on the top surface of the substrate.

7. The semiconductor device of claim 6, wherein the lower pad comprises:
   a first surface contacting the second electrode;
   a second surface spaced apart from the first surface and contacting the top surface of the substrate; and
   a sidewall linking the first and second surfaces,
   wherein the sidewall of the lower pad is in contact with the buffer layer and the channel layer.

8. The semiconductor device of claim 5, wherein the upper metal layer includes a first upper metal layer contacting the first electrode and a second upper metal layer contacting the second electrode; and
   wherein the first upper metal layer is spaced apart from the second upper metal layer.

9. The semiconductor device of claim 5, wherein the upper pad is vertically spaced apart from the first electrode.

10. The semiconductor device of claim 5, wherein one of the first and second electrodes is a source electrode;
    wherein the other of the first and second electrodes is a drain electrode; and
    wherein the third electrode is a gate electrode.

11. The semiconductor device of claim 5, wherein the substrate has a thickness of about 10 μm to about 100 μm.

* * * * *